(12) United States Patent
Pichler et al.

(10) Patent No.: US 6,949,389 B2
(45) Date of Patent: Sep. 27, 2005

(54) ENCAPSULATION FOR ORGANIC LIGHT EMITTING DIODES DEVICES

(75) Inventors: Karl Pichler, Santa Clara, CA (US); Kyle D. Firschknecht, Livermore, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/137,163

(22) Filed: May 2, 2002

(65) Prior Publication Data

US 2003/0205845 A1 Nov. 6, 2003

(51) Int. Cl.⁷ ........................ H01L 21/00; H01L 21/425
(52) U.S. Cl. .............................. 438/26; 438/28; 438/30; 438/48; 438/55; 438/531; 438/627
(58) Field of Search ...................... 438/26, 28, 30, 438/48, 55, 531, 624, 627, 641; 257/53, 21, 59.414, 431, 701, 760

(56) References Cited

U.S. PATENT DOCUMENTS

| | | | |
|---|---|---|---|
| 4,682,565 A | 7/1987 | Carrico | |
| 5,369,151 A | * 11/1994 | Fujibayashi et al. | 523/414 |
| 5,703,433 A | * 12/1997 | Fujii et al. | 313/484 |
| 5,757,126 A | 5/1998 | Harvey, III et al. | |
| 5,874,804 A | 2/1999 | Rogers | |
| 5,895,228 A | 4/1999 | Biebuyck et al. | |
| 6,072,227 A | * 6/2000 | Yau et al. | 257/642 |
| 6,102,541 A | 8/2000 | Kuo | |
| 6,103,456 A | * 8/2000 | Tobben et al. | 430/317 |
| 6,146,715 A | * 11/2000 | Kim et al. | 427/555 |
| 6,148,764 A | * 11/2000 | Cui et al. | 118/723 ME |
| 6,268,695 B1 | 7/2001 | Affinito | |
| 6,271,135 B1 | * 8/2001 | Palmans et al. | 438/687 |
| 6,387,802 B1 | * 5/2002 | Marsh | 438/680 |
| 6,498,114 B1 | * 12/2002 | Amundson et al. | 438/780 |
| 6,500,604 B1 | * 12/2002 | Dimitrakopoulos et al. | 430/322 |
| 6,522,067 B1 | 2/2003 | Graff et al. | |
| 6,524,937 B1 | * 2/2003 | Cheng et al. | 438/574 |
| 6,570,325 B2 | 5/2003 | Graff et al. | |
| 6,590,157 B2 | * 7/2003 | Boroson et al. | 174/52.2 |
| 6,720,203 B2 | 4/2004 | Carcia et al. | |
| 2001/0052752 A1 | * 12/2001 | Ghosh et al. | 313/512 |
| 2002/0094624 A1 | * 7/2002 | Ahn et al. | 438/200 |
| 2002/0155661 A1 | * 10/2002 | Massingill et al. | 438/244 |
| 2003/0194493 A1 | * 10/2003 | Chang et al. | 427/248.1 |

FOREIGN PATENT DOCUMENTS

| | | |
|---|---|---|
| DE | 196 03 746 | 4/1997 |
| EP | 1183567 B1 | 5/2003 |
| WO | WO 00/36665 | 6/2000 |
| WO | 01/81649 A1 | 11/2001 |
| WO | 02/05361 A1 | 1/2002 |

OTHER PUBLICATIONS

Hayes, Donald J. et al., "Low-cost display assembly and interconnect using ink-jet printing technology", *Journal of the SID*, 9/1, 2001, pps. 9–13.

Le, Hue P., "Porgress and Trends in ink-jet Printing Technology, Part 4", *Society for Imaging Science and Technology*, 42/1, Jan./Feb. 1998, pps. 1–9.

Wilson, J.S. et al., "Spin-dependent exciton formation in π-conjugated compounds", *Nature*, 413, Oct. 2001 pp. 828–831.

* cited by examiner

*Primary Examiner*—Hsien-Ming Lee
(74) *Attorney, Agent, or Firm*—Thomas George

(57) ABSTRACT

An embodiment of an encapsulated OLED device is described. This embodiment of the encapsulated OLED device is formed by: fabricating multiple OLED devices on a substrate; depositing at least one planarization layer on the OLED devices; hardening the at least one planarization layer in a patterned manner such that the hardened region substantially covers the OLED device; removing areas of the at least one planarization layer that are not hardened; and selectively depositing at least one barrier layer over the hardened region.

53 Claims, 8 Drawing Sheets

ENCAPSULATION FOR ORGANIC LIGHT EMITTING DIODES DEVICES

BACKGROUND OF THE INVENTION

One of the last manufacturing steps in the construction of an organic light emitting diode ("OLED") is encapsulation. Encapsulation is a way to protect the OLED device from the damaging environmental effects—primarily from oxygen and moisture. It is well known in the art to encapsulate an OLED device by physically mating a top glass (or other suitable material) layer over, but usually not touching, the OLED device with an epoxy border. The glass, together with its epoxy border, typically is an effective, tried-and-true way to provide the necessary environmental protection required for long-lived OLED usage.

Of late, there has been some discussion in the art to provide a cheaper and better manner of encapsulation, called "direct thin-film" encapsulation. In this manner, thin film encapsulation is typically described as a "polymer multi-layer" (PML) comprising alternating and repeating layers of an organic (usually acrylate or the like) and a barrier layer. FIG. 1 depicts a typical PML structure 100 as is currently known in the art. A glass (or other suitable material) substrate 102 provides the support structure for OLED structure 104 formed on top of substrate 102 in any manner known in the art. Layers 102 and 104 form typically the structure that requires encapsulation—either by known techniques or by the encapsulation techniques of the present invention.

Typically, for PML structures, a planarization layer 106 is formed on top of OLED structure 104. Planarization layer 106 typically is an organic layer (e.g. acrylate or the like) and is provided to give a planar surface for the deposition of the PML structure 112a. PML structure 112a typically comprises barrier layer 108 and another planarization layer 110.

Barrier layer 108 typically comprises a sputtered metal, metal-oxide or a dielectric layer. Barrier layer 108 provides the necessary environmental isolation from the corrosive effects of oxygen and moisture. Planarization layer 110 may again comprise an organic layer (e.g. acrylate or the like) and is typically laid down to provide a planar surface for deposition of the barrier layer 108. This entire PML structure 112a may be repeated (e.g. PML structure 112b)—possibly several times—for additional encapsulation of the entire OLED device.

The advantages of direct thin-film encapsulation over the prior art are primarily cost reduction and improved reliability. Using direct thin-film encapsulation, the package may also be thinner and/or lighter and/or mechanically more flexible. Several structures and steps of the prior art may be excluded with this process. For example, there is no need for a separate glass plate, no need for an epoxy seal, no need for a getter (which is typical in the prior art).

One of the problems of the direct thin film encapsulation occurs with the barrier layer. The barrier layer should ideally not contain any point defects (i.e. pin holes) in its surface—otherwise its usefulness as a barrier layer is severely compromised. That is primarily the reason that a planar organic layer is typically used as a substrate upon which the barrier layer is deposited.

This problem is exacerbated during the batch fabrication of many OLED devices upon a single large sheet of glass—such as shown as a top view in FIG. 2. Upon such a single glass sheet 200, several tens (or even hundreds) of OLED devices 202 may be so fabricated. As depicted, OLED devices 202 are typically laid down in rows and columns on a large sheet of glass 200. Typically, each OLED 202 comprises an electrical contact area 204 for electrically mating the OLED device to a driver circuit.

At the thin film encapsulation step, the PML structure is deposited where at least one UV-curable organic liquid material is deposited over the entire glass sheet containing the multiple OLED devices. This organic layer is subsequently cured—followed by a deposition of a barrier layer (e.g. sputtered metal-oxide or dielectric). Such a process may be repeated to form a PML structure—primarily to avoid external particle/dirt-induced pinhole defects. After encapsulation, singulation is performed, for example by forming scribe and break lines 206 upon the entire structure so that individual OLED devices 202 may be separated and further processed.

The problem with this PML technique is that the only part of the device that requires encapsulation is the OLED structure itself—and not, e.g., the electrical contact pads. In fact, the contact pad must typically be exposed for electrical mating with external driver circuitry. So, at a minimum, additional processing must be performed for the removal of the PML structure over these areas.

Another potential problem with the current PML techniques is that by having the PML layer over the scribe and break lines and/or the glue lines the integrity of the sealed package may be deteriorated, for example by delamination of the PML layer over these areas.

Approaches other than PML are known in the prior art that use combination of organic planarizing layers together with inorganic barrier layers to achieve some degree of thin-film direct encapsulation. Organic planarization layers that do not require special cure may be used as well as layers that are electron-beam or thermally cured, in vacuum or gas atmosphere, preferably inert gas. Such organic layers may also be deposited in non-liquid form, e.g. be evaporated or plasma-deposited (e.g. Parylene).

SUMMARY OF THE INVENTION

In one embodiment, herein is described a method of encapsulating a plurality of OLED devices fabricated upon a substrate, the steps of said method comprising:

fabricating a plurality of OLED devices on a substrate;

depositing at least one planarization layer upon said OLED devices;

hardening said at least one planarization layer in a patterned manner such that the hardened region substantially covers said OLED device;

removing areas of the at least one planarization layer that are not hardened; and selectively depositing at least one barrier layer over said hardened region.

In yet another embodiment, herein is described a method of encapsulating a plurality of OLED devices fabricated upon a substrate, the steps of said method comprising fabricating a plurality of OLED devices on a substrate;

depositing at least one planarization layer upon said OLED devices wherein said planarization layer is deposited as an unpatterned liquid film;

selectively depositing at least one barrier layer over said planarization layer; and removing said areas of unwanted planarization layer.

In yet another embodiment, herein is described a method of encapsulating a plurality of OLED devices fabricated upon a substrate, the steps of said method comprising:

fabricating a plurality of OLED devices on a substrate;

selectively depositing at least one planarization layer upon said OLED devices; and selectively depositing at least one barrier layer over said planarization layer.

In yet another embodiment, herein is described a method of encapsulating a plurality of OLED devices fabricated upon a substrate, the steps of said method comprising:

fabricating a plurality of OLED devices on a substrate;

depositing a mask on top of said substrate, such that mask openings are placed on top of said OLED devices;

depositing at least one planarization layer upon said mask;

removing said mask from said substrate; and selectively depositing at least one barrier layer over said planarization layer.

DETAILED DESCRIPTION OF THE INVENTION

Figure 1:
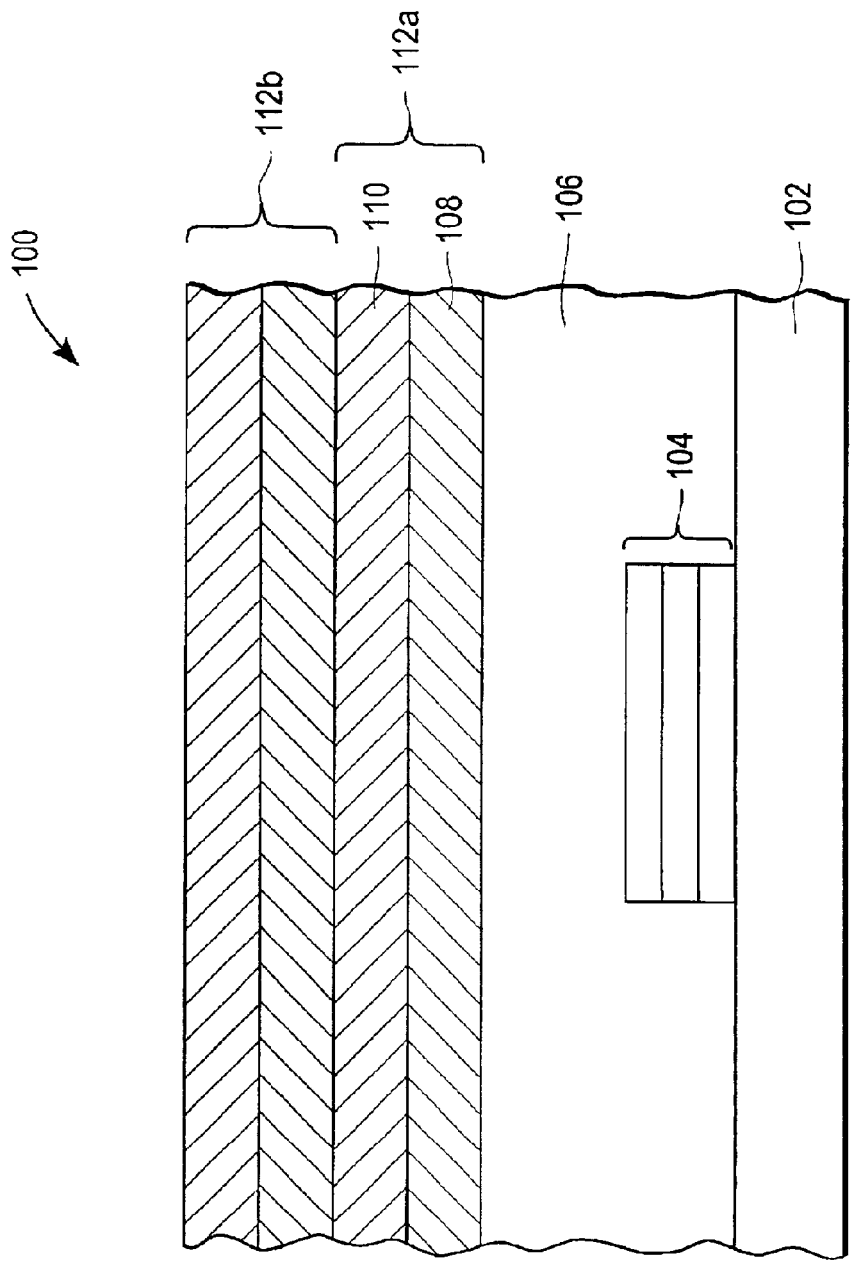
FIG. 1 is side view of a typical PML encapsulation structure formed over an OLED device.
Figure 2:
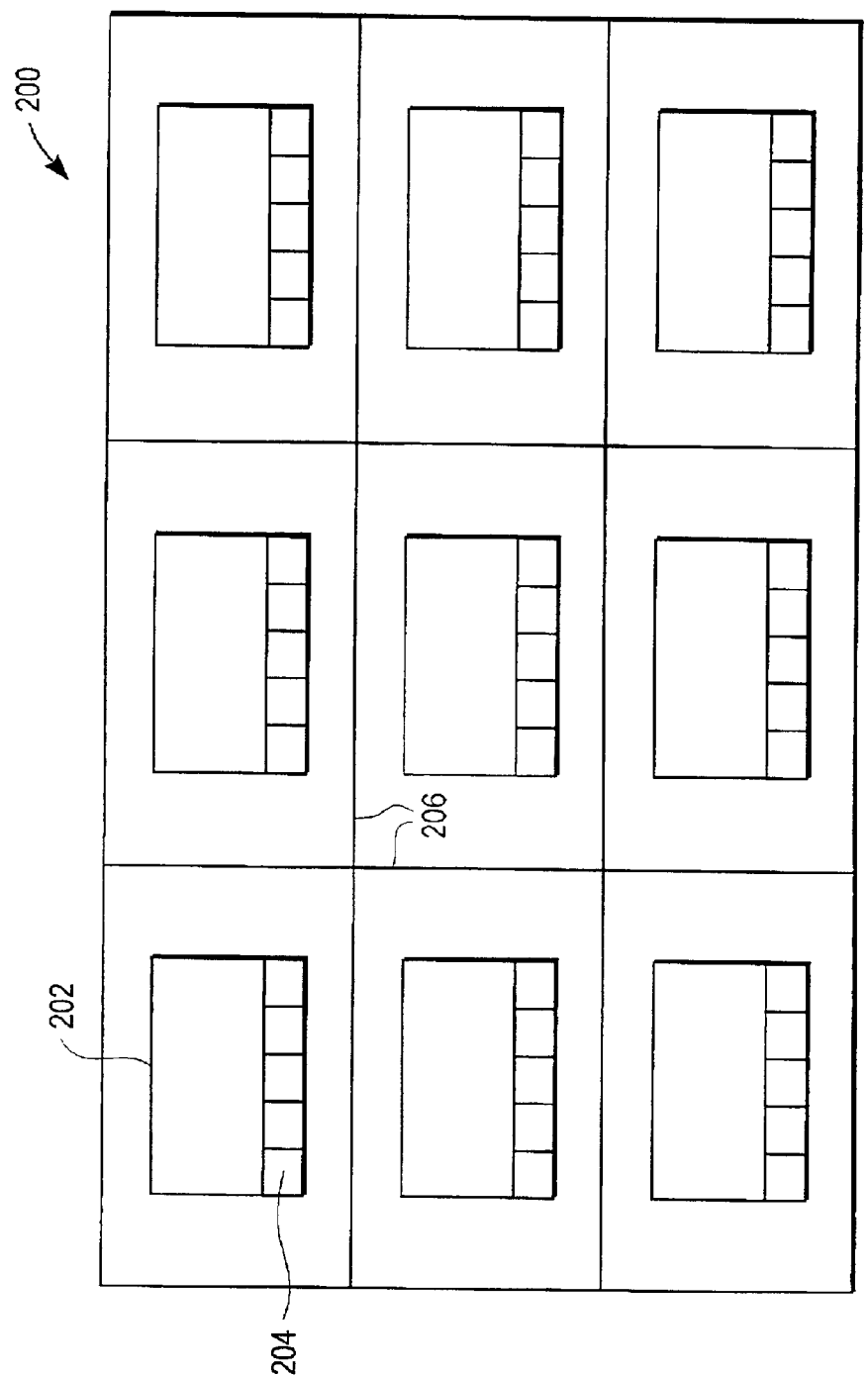
FIG. 2 is a top view of an array of mass-produced OLED structures upon a large glass substrate.
Figure 3A:
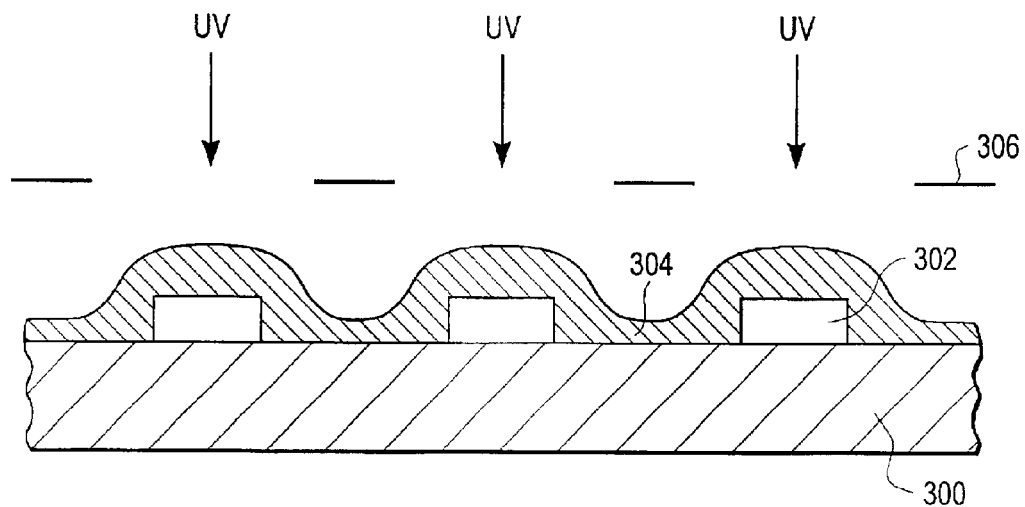
FIGS. 3A and 3B are a set of side view diagrams showing the processing steps of one embodiment of the encapsulation techniques as made in accordance with the principles of the present invention.
Figure 3B:
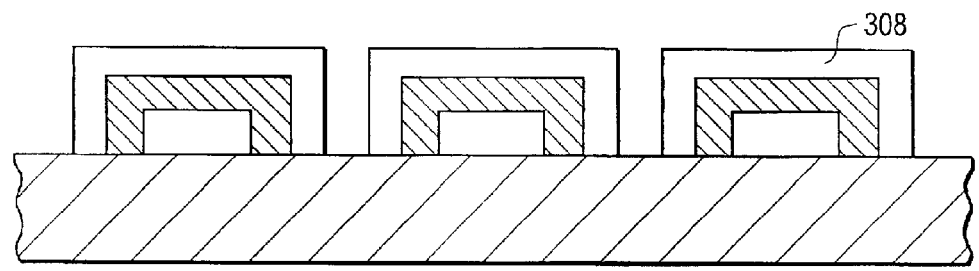

Turning attention to FIGS. 3A–3B, there is shown a series of side views of OLED devices being encapsulated in accordance with the principles of the present invention. In FIG. 3A, substrate 300 has formed upon its surface several OLED devices 302. For the purposes of the present invention, this structure is to be construed very broadly. For example, substrate 300 could be comprised of glass (possibly with ITO as a first electrode), quartz, plastic foils, metal, metal foils, silicon wafers or any other potential substrate material that encompasses very broad classes of OLED devices. Broadly, the OLED device could be bottom-emitting or top-emitting. The device could have the bottom electrode as anode or cathode respectively—in either a top or bottom emitting configuration.

Additionally, the encapsulation techniques and structures of the present invention could be used for any number of applications—e.g. active matrix, passive matrix, segmented, alpha-numeric, or backlight OLED displays or any combination thereof. It will be appreciated that any of these OLED devices could be some that have structures patterned on the OLED substrate that are much higher than the OLED stack itself—e.g. several micron high row separators (e.g. mushrooms) or an ink-confinement well/bank such as used in ink-jet-printed OLEDs. It is intended that the scope of the present invention includes encapsulating over these structures that are within the active areas of the display.

Additionally, it should be appreciated that the scope of the present invention also includes other displays and any electronic or other devices that require encapsulation—e.g. general organic electronic devices such as organic transistors, detectors, solar-cells, etc. (particular OLEDS) and also includes displays for lighting such as OLED-based light sources and backlights.

It should be appreciated that the present invention also comprises a myriad of electronic devices, said devices comprising: a substrate; a plurality of active areas disposed upon said substrate; a plurality of planarization layers disposed on said substrate whereby said planarization layer cover substantially only said active areas; and a plurality of barrier layers disposed on said substrate whereby said barrier layers cover substantially only said planarization layers. In particular, the present invention comprises electronic devices such as an OLED, an organic electronic circuit, an organic detector, an organic solar cell.

A UV-curable organic layer 304 is substantially deposited over the entire display glass comprise a plurality of OLED devices. Such suitable organic layer could be a liquid comprising acrylate, together with a photo initiator for selective curing—or other materials such as generally known in the PML and UV or otherwise curable organic planarization layer technology/prior art.

It should be appreciated that layer 304 could also be any suitable planarization layer. For example, an inorganic or hybrid planarization layer might also suffice as a buffer layer that has desirable planarizing and/or protecting properties from the barrier layer deposition process.

Additionally, a wet-processable and post-processing curable organic-metallic compounds such as spin-on glasses might suffice. Such an organic layer might provide a planar structure on which to deposit a barrier layer and to substantially cover point defects (e.g. dirt particles) in lower layers. It is generally desirable that the organic layer be deposited in sufficient quantity so that any such layer is no longer "conformal" to the point defect—i.e. any point defects are not geometrically projected upwards into layers deposited above. Such a first organic layer might also serve to protect the underlying OLED from potential damage due to the deposition of the first barrier layer.

In yet other embodiments, non-PML approaches could be used within the scope and principles of the present invention. For example, a non-liquid evaporated organic—e.g. polysiloxane as might be applied to later Figures.

It will be appreciated that there are many manners of depositing this organic layer upon the OLED device. For example, the layer could be either evaporated or flash evaporated. Alternatively, a liquid organic layer could be spun coated, dip coated, roll coated, spray-coated or blade coated—as is well known in the art. Additionally, other suitable printing technology could be employed, in particular, screen-printing or ink-jet printing.

Once the organic layer is deposited upon the OLED devices, UV-light is used to selectively cure the layer over the OLED devices to produce the desired cross-linking. This step could be accomplished by a mask 306 which blocks the UV light from areas where it is desired that the organic layer be removed. Alternatively, the cross-linking could be accomplished by using a UV light having an optical patterning system, such as a projection exposure system. In another embodiment, the cross-linking could be accomplished by selectively scanning the UV beam across the plate. In yet another embodiment, the layer need not necessarily have to be UV-cured. Instead, it could be thermally cured—e.g. using a heat source that has a temperature profile, an IR laser, a stencil/stamp, or e-beam cured. Other methods might include: cross-linking, patterned heat transfer system, patterned IR source, masked IR source, scanned IR source, patterned e-beam, masked e-beam and scanned e-beam.

Once the organic layer has been selectively cross-linked, the remaining uncross-linked layer should be removed. This removal may be accomplished by thermal evaporation (e.g. by heating the substrate) or by using short higher temperature pulses (e.g. placing the OLED plate onto a hotplate). Other removal methods are also possible—e.g. pumping in a vacuum to remove the liquid organic layer. A combination of techniques is also possible applying thermal energy while pumping in a vacuum.

Still other methods of removal are possible—immersion in a rinse tank, spray-rinsing, ultra-sonicing (either dry or wet), or some combination of techniques (e.g. dry ultrasonic or mega-sonic in a vacuum). Plasma etching techniques could also be employed to aid the removal process. Additionally, laser-assisted methods such as laser ablation or providing heat via laser might suffice.

Once the residual organic layer has been removed, then a barrier layer is selectively deposited on the OLED plate. FIG. 3B shows that-barrier layer 308 is selectively deposited over the OLED devices where the organic layer has been also deposited. Barrier layer 308 comprises any material that is suitable to protect the OLED device from the environmental effects of oxygen and moisture—and, as such, should be relatively impervious to them. Such barrier layer material might comprise a metal-oxide or a dielectric layer, e.g. SiOx (e.g. SiO2), SiNx (e.g. Si2N3), SiOxNy, AlOx (e.g. Al2O3), AlNx, ITO, ZnOx, Al-doped ZnOx, or any high barrier dielectrics or conductive oxides. Generally, any inorganic materials known in the prior art that give good oxygen and water barrier properties would suffice for purposes of the present invention. In the case of a bottom emitting display, the encapsulation does not have to be transparent, then metal or alloy films (e.g. Al or alloys, Cr, Cu or alloys, etc.) or non-transparent or colored dielectric films are potentially suitable, both evaporated or sputtered.

The deposition of the barrier layer can be any suitable method known in the art to deposit dielectric layers, metal-oxides, metals or alloys. For example, sputtering or reactive sputtering (DC, AC, pulsed, or a combination thereof) would suffice. Additionally, evaporation of such dielectrics (resistive heating or electron beam) or metal films is possible. Further, ion-beam assisted or other plasma-enhanced deposition methods are also possible.

It should be appreciated that other embodiments are possible. For example, the patterned UV cure described herein could be done such that the thickness of the planarization layer gradually decreases from the value over the active area to zero or near zero somewhere outside the active area. This may facilitate a nice smooth encapsulation of the OLED (or other structures) plus the planarization layer from the active area out to where there is no encapsulation (e.g. scribe/break line and/or contacts). It might be desirable to have the barrier layer slightly larger in area to cover the planarization layer because the planarization layer might not have such a sharp step and such a barrier layer coverage might provide adequate side step coverage. This embodiment applies also to the embodiments discussed herein, as they may be tuned to provide such a smooth transition of the buffer layer by way of re-flow or evaporation or printing or partial pre-cure and the like of the planarization layer at the edges prior to barrier layer deposition. In yet another embodiment, it might be desirable to encapsulate only the organic light-emissive areas (e.g. pixels) and leave the contact pads, auxiliary encapsulation areas, scribe/break areas free of the organic and barrier layers.

Figure 4A:
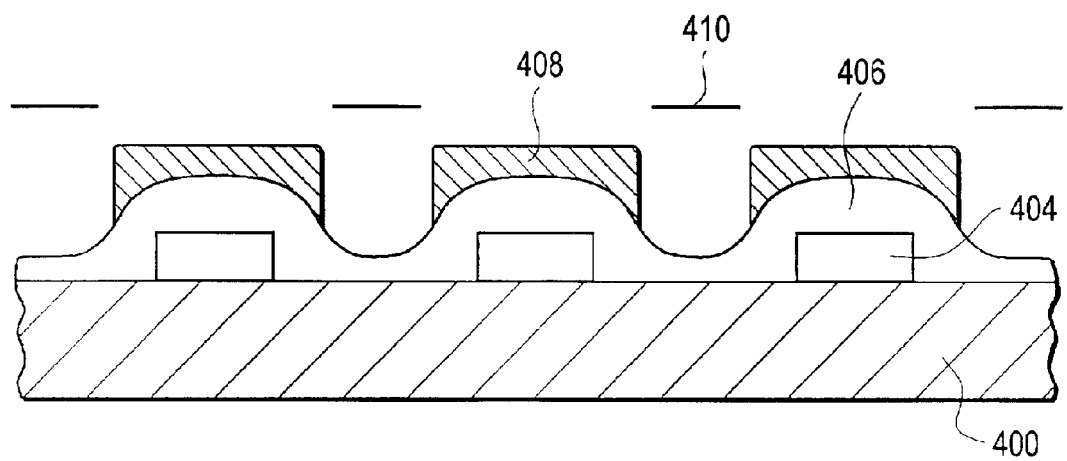
FIGS. 4A and 4B are a set of side view diagrams showing another embodiment of the present invention.
Figure 4B:
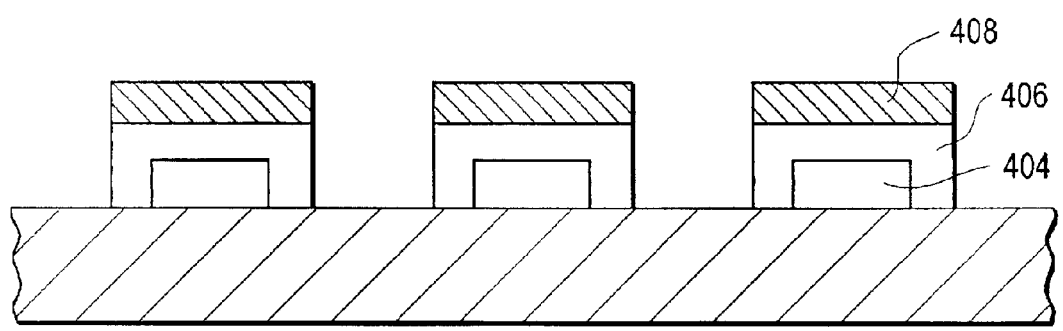

FIGS. 4A and 4B depict another embodiment of the present invention and particularly a different manner of encapsulating OLED devices. FIG. 4A shows a step in the processing of present invention in which OLED devices 404 are formed on top of substrate 402. Organic layer 406 is deposited over the entire substrate, covering OLED devices 404. Then, barrier layer 408 is selectively deposited in a manner known in the art—e.g. through a mask or screen 410—situated on top of the OLED devices. FIG. 4B shows the next step in the processing after that portion of the unwanted organic layer 406 is removed by methods known in the art.

It will be appreciated that organic layer 406 may or may not be cured in its entirety and may or may not be cured selectively through a mask or screen. Likewise, it might be desirable not to cure the organic layer at all. In several embodiments, the organic may be either fully cured before patterned barrier layer deposition, partly cured or completely non-cured and that after the barrier layer deposition, there may be another cure step to ensure that the underlying organic is cured to the intended level, if it wasn't already before the barrier layer deposition. If the unwanted organic layer is etched away (by any number of etching methods known—e.g. chemical (dry or wet) etch, plasma-assisted (with or without oxygen), reactive-ion etching, anisotropic reactive-ion etching, etc.) then barrier layer 408 might act as an effective etch stop as well as laser assisted/based removal (e.g. laser ablation).

In addition, the organic layer could be deposited in any manner previously described (e.g. evaporation of a plurality of reactive organic molecules to form a condensed conformal layer on the substrate) or by well-known Parylene coating methods.

In one embodiment, it may be the case that the edges of the active areas are exposed; however, even if the planarization layer is only a few microns thick and the planarization+ barrier layer perimeter around the active device is tens or even over 100 microns wide, then permeation of e.g. water through this thin planarization layer along the 10's or >100 microns should be slow. Alternatively, a second barrier layer may be larger than the area of the planarization layer so that the exposed planarization layer edge is covered with barrier layer also. This could also be achieved by making a potential second planarization layer+barrier layer stack wider than the first and so on. This can naturally already be done in previous embodiments by making the barrier layer mask wider.

Figure 5:
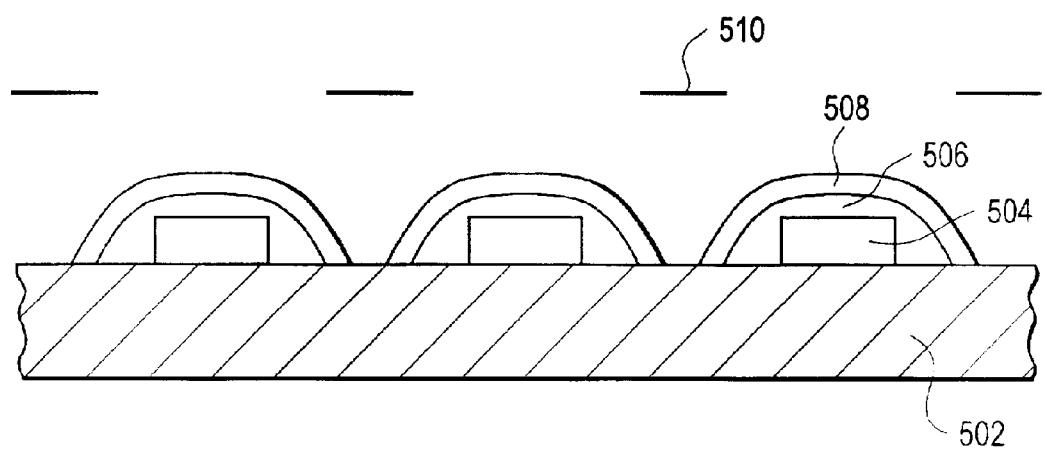
FIG. 5 is a side view of yet another embodiment of the present invention.
Figure 6A:
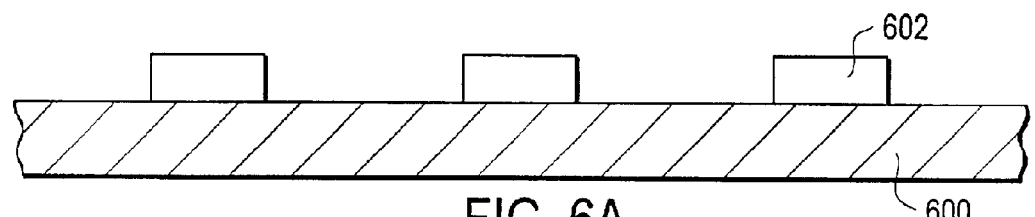
FIGS. 6A through 6E are a set of side view diagrams showing still yet another embodiment of the present invention.
Figure 6B:
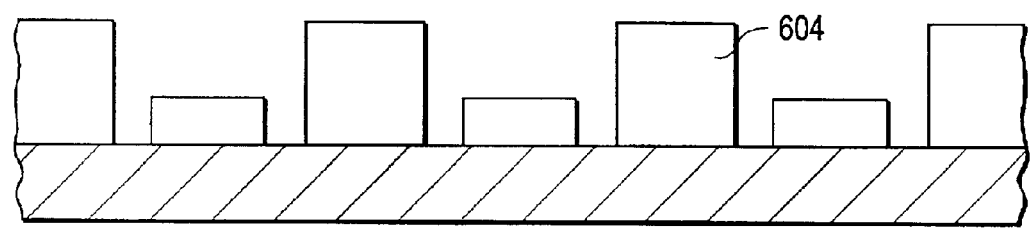
Figure 6C:
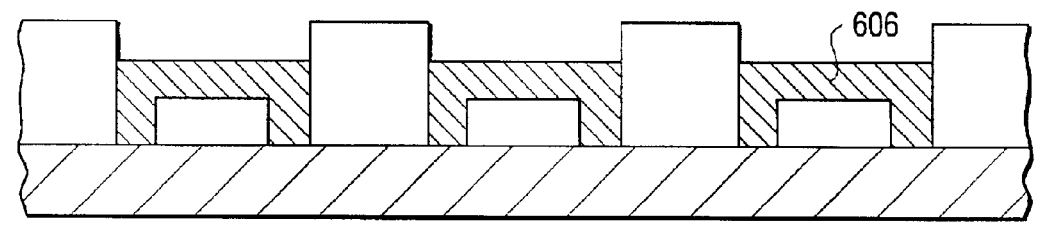
Figure 6D:
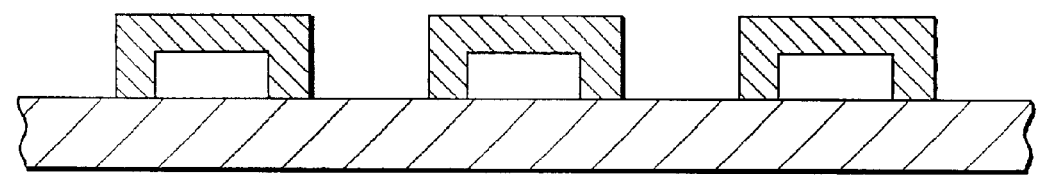
Figure 6E:
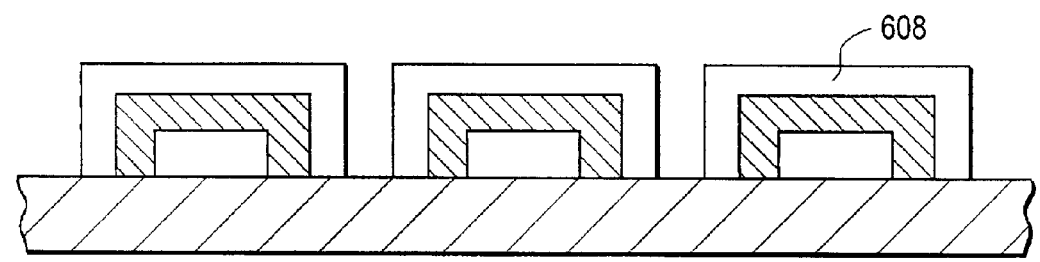

FIG. 5 depicts another embodiment of encapsulation techniques in accordance with the present invention. In this embodiment, OLED device 504 is again formed upon substrate 502. Organic layer 506 is deposited in a patterned fashion as well as barrier layer 508. As organic layer 506 is deposited selectively; there may be no need to cure the layer. It should be appreciated that the cure and patterning aspects could be independent; —relating to the type of material and deposition technique of for the planarization layer. For example, if UV (or other)-curable liquids such as for PML or screen- or ink-jet print are used, then it is possible to cure. Alternatively, if evaporation of an organic through a mask is the relevant step, there may be no need to cure.

The manner of selectively depositing the organic layer and the barrier layer may be accomplished in a variety of ways. For example, organic layer may be selectively deposited though a shadow mask (as depicted as mask 510) or by ink jet deposition or other screen printing techniques. In fact, generally any printing techniques suitable to deliver the desired planarization layer material can be used. In similar fashion, barrier layer 508 may be selectively deposited. For alternative embodiments, it is possible to employ all options for selective deposition: same mask, different masks and also same mask with different substrate to mask distances (e.g. smaller distance for planarizing layer and then larger distance for barrier such that the barrier coverage is wider—because of slight non-directionality of and differences in the materials deposition).

In the case of printing, screen-printing, ink-jet-printing, the masks can either be not required (ink-jet) or possibly different from that used for a patterned sputter-deposited barrier layer deposition. For other embodiments, it may also be possible to partially cure the planarization layer, deposit the barrier layer and then complete the cure of the planarization layer, if necessary.

FIGS. 6A through 6E depict yet another embodiment of encapsulation techniques in accordance with the principles of the present invention. First, OLED device 602 is formed on substrate 600. Then, mask 604 is formed onto substrate 600 with mask openings for OLED devices 602.

It will be appreciated that a suitable mask might be formed in many possible manners. For example, such a mask might be a film laminated to the OLED or a mask pressed or pushed or clamped to the OLED. Additionally, such mask might be a multi-use mask or a one-off that then gets removed. Such mask might comprise a metal, ceramic, or plastic foil or sheet; it could also comprise a PTFE (Teflon) or a poly-siloxane type material (e.g. polydimethylsiloxane) or generally any material that does not stick to the OLED (which might cause damage or delamination when the mask is removed) and/or a material to which the encapsulation organic does not stick so well so that the mask's removal after encapsulation organic deposition and cure (complete or partial) does not remove the organic.

The mask might be such that it could be brought into contact with the OLED sufficiently well so that the encapsulation organic is confined over the desired areas and does not seep under the areas where the encapsulation organic is not desired (e.g. contact pads). Such a mask might comprise a "stamp" mask. Such a mask could be pressed on, clamped on, or the mask could be made of magnetic material and thus held by magnetic forces (e.g. with sheet magnet behind substrate that 'sucks' the mask to substrate). Additionally, the mask could be multi-use mask or one-off use. Vacuum-suction masks may also suffice. Additionally, a laminated film-mask could also suffice.

Once mask 604 is deposited, organic layer 606 is deposited in any suitable manner. For example, organic layer could be dispensed, squashed, rolled, printed, blade-coated, dropped into, sprayed onto the mask openings. Once deposited, then the organic layer may or may not be cured—either partially or completely prior to the removal of mask 604. The mask could be removed by any means known in the art—e.g. by peeling it off; mechanical removal if a stencil, and the like.

It will be appreciated that the edges of the planarization layer may or may not reflow such that the subsequently deposited barrier gives better barrier edge coverage.

After the mask is removed, then barrier layer 608 is selectively deposited over the planarization layers covering the OLED devices. Any known technique for such selective deposition is suitable for purposes of the present invention. For various alternative embodiments, it is possible to either fully cure then remove mask; partly cure then remove mask; no cure then remove mask. These variations may also be in combination with potentially another cure after the barrier layer deposition. Specifically, it might be possible to slightly cure then remove mask then e.g. heat to reflow to smoothen the edges—then continue with full cure/barrier layer deposition.

In yet another embodiment, it is also possible to deposit both the planarization and barrier layer(s) before the removal of the mask.

In yet other embodiments, all encapsulation process steps could be accomplished in an inert atmosphere (i.e. with reduced oxygen, ozone, other reactive gases and in particular moisture). Alternatively, only the first organic layer and first barrier layer ("dyad") could be done in an inert atmosphere. Alternatively, only the first organic layer could be done in an inert atmosphere.

Other embodiments might include encapsulation with a secondary encapsulation layer for additional protection. This might be accomplished by laminating, glueing or otherwise depositing a plastic, metal, metal plus plastic foil, thin glass, thick glass or metal sheet over said OLED display sheet. Said secondary encapsulation may include a getter material (e.g. zeolite, reactive metal, reactive metal-oxide, metal-sulfide, etc.; in film, powder, paste, tablet, etc. form) in the package to absorb water, oxygen or other reactive gases. Singulation could be accomplished either before or after secondary encapsulation.

Figure 7A:
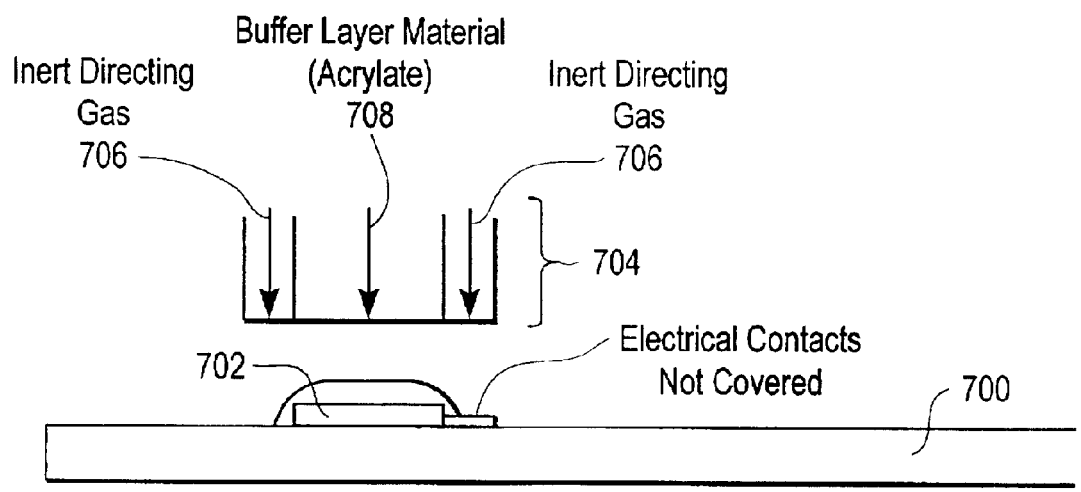
FIGS. 7A through 7C are a set of diagrams depicting a gas nozzle deposition system made in accordance with the principles of the present invention.
Figure 7B:
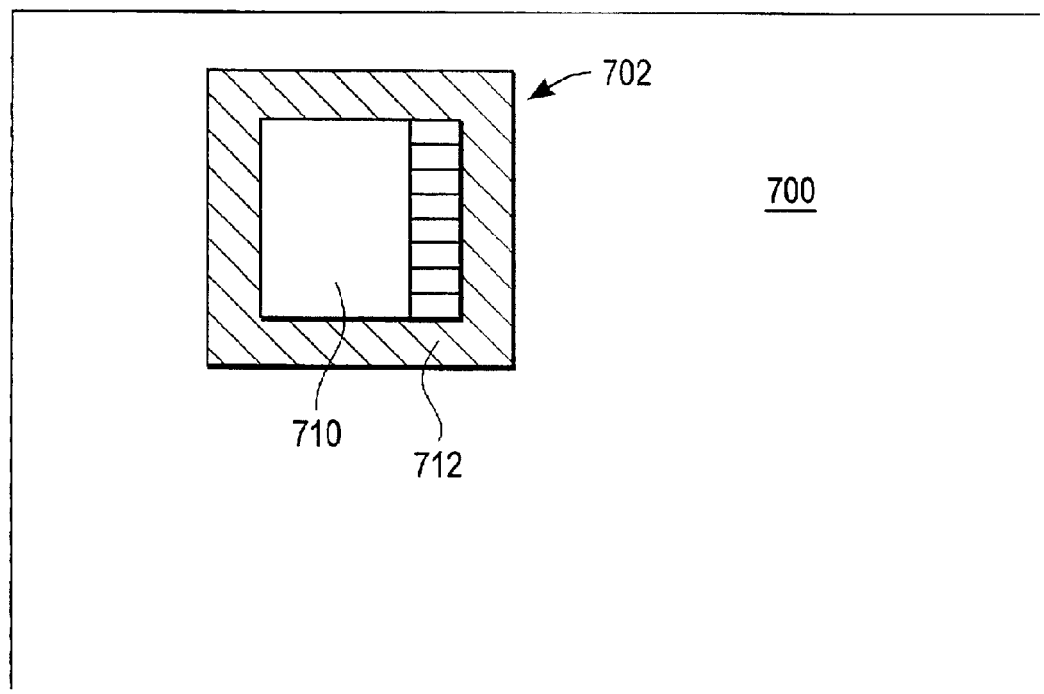
Figure 7C:
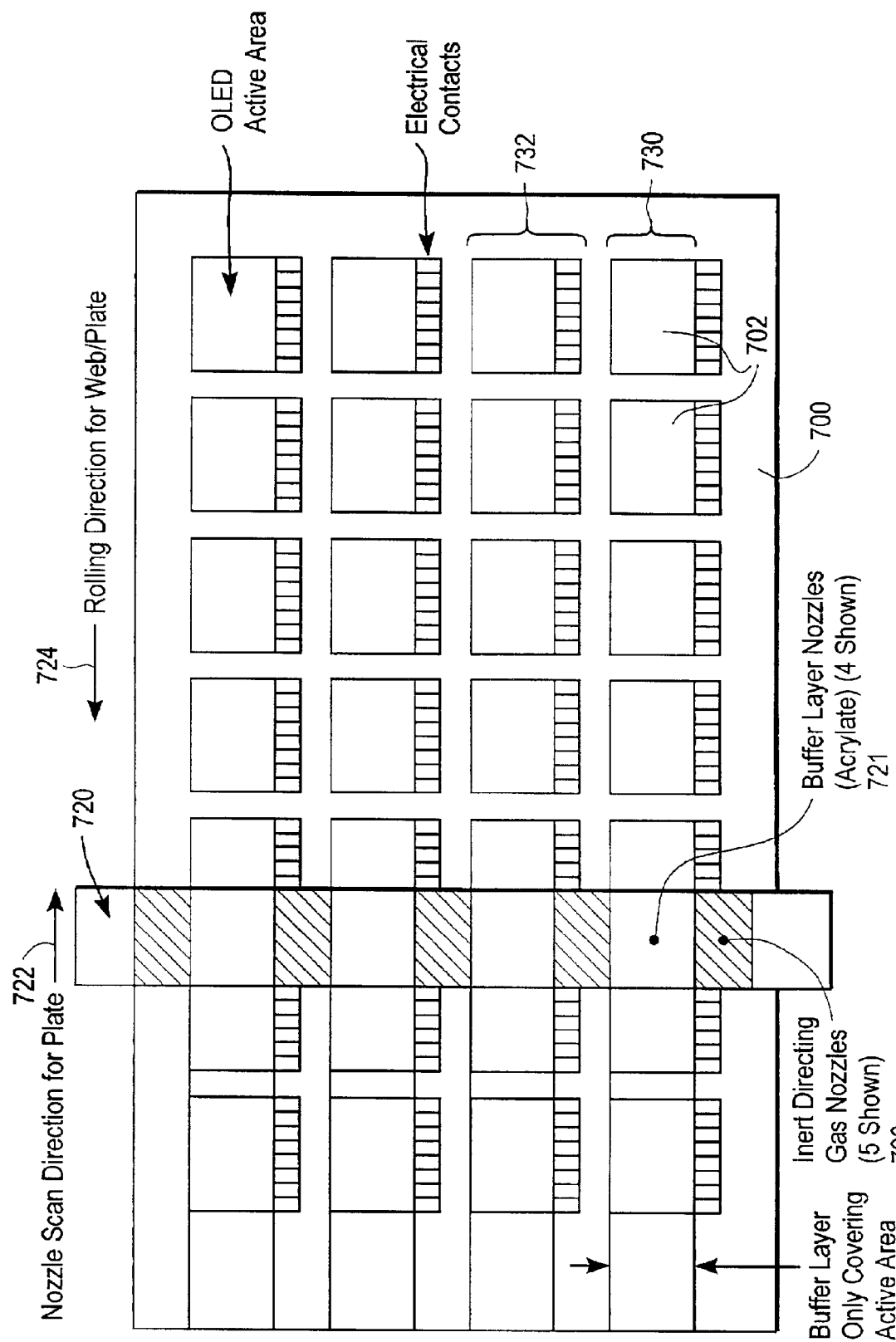

FIGS. 7A through 7C depict a novel gas nozzle deposition system for the deposition of several layers, including the planarization layer. FIG. 7A shows one gas nozzle 704 as it is depositing a layer onto a device 702 upon a substrate 700. Nozzle 704 comprises at least a nozzle 706 that directs a gas, preferably inert, and a nozzle 708 that directs the material to be deposited—e.g. acrylate—onto the device. The gas directs the depositing material away from areas that should be free of deposition. FIG. 7B shows the device 702 after having been covered with the layer by the gas nozzle system. More precisely, area 710 has been covered with the layer—while area 712 is left free of the deposit. Such an area 712 might represent electrical contacts, scribe lines, or other areas that are desired to be free of such deposit.

FIG. 7C depicts the action of an array of such gas nozzles 720 that effects a deposition over a plate 700 of devices 702. Array 720 would comprise a plurality of planarization layer nozzles 721 and inert gas nozzles 723 that are advantageously disposed above the plate of devices so that the layer being deposited is done in only those areas desired. Area 730 is such a desired area for deposition, out of a total area 732 for the device. Array 720 and plate 700 could be placed into relative motion in order to effect an efficient deposition upon a plurality of devices. Direction 722 depicts a possible motion of the array over the plate; while direction 724 depicts a possible motion of the plate under the array—any combination of the two motions are also possible.

It has now been shown several embodiments of advanced encapsulation techniques performed in accordance with the principles of the present invention. It will be appreciated that the present invention is meant to cover any and all obvious variations as described herein.

What is claimed is:

1. A method of encapsulating a plurality of devices fabricated upon a substrate, the steps of said method comprising:

fabricating a plurality of devices on a substrate;
depositing at least one planarization layer upon said devices;
hardening said at least one planarization layer in a patterned manner such that the
hardened region substantially coven said device;
removing areas of the at least one planarization layer that are not hardened; and
selectively depositing at least one barrier layer over said hardened region.

2. The method as recited in claim 1 wherein said step of depositing at least one planarization layer comprises spin coating.

3. The method as recited in claim 1 wherein said step of depositing at least one planarization layer comprises flash evaporation.

4. The method as recited in claim 1 wherein said step of depositing at least one planarization layer comprises evaporation.

5. The method as recited in claim 1 wherein said step of depositing at least one planarization layer comprises blade coating.

6. The method as recited in claim 1 wherein said step of depositing at least one planarization layer comprises roll coating.

7. The method as recited in claim 1 wherein said step of depositing at least one planarization layer comprises dip coating.

8. The method as recited in claim 1 wherein said step of depositing at least one planarization layer comprises spray-coating.

9. The method as recited in claim 1 wherein said step of depositing at least one planarization layer comprises screen printing or ink jet printing.

10. The method as recited in claim 1 wherein the step of hardening said at least one planarization layer in a patterned manner comprises flood-exposure of UV light through a mask or scanning a line-source of UV light through a mask.

11. The method as recited in claim 1 wherein the step of hardening said at least one planarization layer in a patterned manner comprises exposure by UV light comprising an optical patterning system.

12. The method as recited in claim 1 wherein the step of hardening said at least one planarization layer in a patterned manner comprises exposure by UV light comprising a UV-beam scanning system.

13. The method as recited in claim 1 wherein the step of hardening said at least one planarization layer further comprises cross-linking, patterned heat transfer system, patterned IR source, masked IR source, scanned IR source, patterned e-beam, masked e-beam or scanned e-beam.

14. The method as recited in claim 1 wherein the step of removing areas of the at least one planarization layer that are not hardened comprises removing by thermal evaporation.

15. The method as recited in claim 14 wherein the step of removing by thermal evaporation further comprises applying a short high temperature pulse.

16. The method as recited in claim 15 wherein the step of applying a short high temperature pulse further comprises placing the plurality of devices onto a hotplate.

17. The method as recited in claim 1 wherein the step of removing areas of the at least one planarization layer that are not hardened comprises removing by pumping in a vacuum.

18. The method as recited in claim 1 wherein the step of removing areas of the at least one planarization layer that are not hardened comprises removing by thermal evaporation and pumping in a vacuum.

19. The method as recited in claim 1 wherein the step of removing areas of the at least one planarization layer that are not hardened comprises washing, blowing away, rinsing, sonicing, or plasma.

20. The method as recited in claim 1 wherein the step of selectively depositing at least one barrier layer further comprises a barrier layer comprising a dielectric, a metal, a metal-oxide or an alloy.

21. The method as recited in claim 1 wherein the step of selectively depositing at least one barrier layer further comprises depositing said barrier layer through a mask.

22. The method as recited in claim 1 wherein the step of selectively depositing at least one barrier layer further comprises depositing the barrier layer in a larger area than the planarization layer.

23. The method as recited in claim 1 wherein the step of selectively depositing at least one barrier layer further comprises depositing metal-oxide, dielectric layer, SiOx, SiNx, SiOxNy, AlOx, AlNx, ITO, ZnOx, Al-doped ZnOx, metal film, or alloy film.

24. The method as recited in claim 1 wherein said plurality of devices are a plurality of OLED displays and substantially only light emissive areas of said plurality of OLED displays are covered by the planarization layer and the barrier layer.

25. A method of encapsulating a plurality of devices fabricated upon a substrate, the steps of said method comprising
fabricating a plurality of devices on a substrate;
depositing at least one planarization layer upon said devices wherein said planarization layer is deposited as an unpatterned liquid film;
selectively depositing at least one barrier layer over said planarization layer; and
removing said areas of unwanted planarization layer.

26. The method as recited in claim 25 wherein said step of depositing at least one planarization layer further comprises curing an organic layer selectively over the substrate.

27. The method as recited in claim 25 wherein said step of depositing at least one planarization layer further comprises curing an organic layer over the entire substrate.

28. The method as recited in claim 25 wherein said step of depositing at least one planarization layer further comprises evaporating a plurality of reactive organic molecules, said reactive organic molecules comprising a condensed conformal film on the substrate.

29. The method as recited in claim 25 wherein said step of depositing at least one planarization layer further comprises a Parylene coating of said organic layer over the substrate, or a plasma-assisted organic material deposition.

30. The method as recited in claim 25 wherein the step of removing said areas of unwanted planarization layer further comprises etching art organic layer.

31. The method as recited in claim 25 wherein the step of removing said areas of unwanted planarization layer further comprises etching an organic layer with a chemical etch process.

32. The method as recited in claim 25 wherein the step of removing said areas of unwanted planarization layer further comprises etching an organic layer with a plasma-assisted etching process, oxygen plasma, reactive ion-etch, anisotropic etch, laser assisted/based removal or laser ablation.

33. The method as recited in claim 25 wherein the step of removing said areas of unwanted planarization layer further comprises removing said organic layer.

34. A method of encapsulating a plurality of devices fabricated upon a substrate, the steps of said method comprising:

fabricating a plurality of devices on a substrate;

selectively depositing at least one planarization layer upon said devices; and selectively depositing at least one barrier layer over said planarization layer.

35. The method as recited in claim 34 wherein the step for selectively depositing at least one planarization layer further comprises depositing by ink jet of an organic layer.

36. The method as recited in claim 34 wherein the step for selectively depositing at least one planarization layer further comprises depositing by screen printing of an organic layer or depositing by gas nozzle.

37. The method as recited in claim 34 wherein the step for selectively depositing at least one planarization layer further comprises depositing an organic layer through a shadow mask.

38. The method as recited in claim 34 wherein the step for selectively depositing at least one barrier layer further comprises depositing by ink jet of said barrier layer.

39. The method as recited in claim 34 wherein the step for selectively depositing at least one barrier layer further comprises depositing by screen printing of said barrier layer.

40. The method as recited in claim 34 wherein the step for selectively depositing at least one barrier layer further comprises depositing by shadow mask, sputtering, ink jet deposition, screen printing evaporation.

41. A method of encapsulating a plurality of devices fabricated upon a substrate, the steps of said method comprising:

fabricating a plurality of devices on a substrate;

depositing a mask on top of said substrate, such that mask openings are placed on top of said devices;

depositing at least one planarization layer upon said mask and said plurality of devices;

removing said mask from said substrate; and selectively depositing at least one barrier layer over said planarization layer.

42. The method as recited in claim 41 wherein the step of depositing said mask further comprises depositing a stamp mask, depositing a laminated film-mask, depositing a vacuum mask, or magnetically held mask.

43. The method as recited in claim 41 wherein the step of depositing said mask further comprises depositing said mask such that said mask is in contact with said substrate.

44. The method as recited in claim 41 wherein the step of depositing said mask further comprises depositing a mask, said mask comprising a material substantially non-sucking to OLED substrate over the areas in between the active areas.

45. The method as recited in claim 41 wherein the step of depositing said mask further comprises depositing a mask, said mask comprising a metal, a ceramic, a plastic, a polymer, PTFE, or poly-siloxane.

46. The method as recited in claim 41 wherein the step of depositing at least one planarization layer further comprises depositing an organic layer over the entire mask.

47. A method of encapsulating a plurality of devices fabricated upon a substrate, the steps of said method comprising:

fabricating a plurality of devices on a substrate;

depositing at least one planarization layer upon said devices; and depositing at least one barrier layer over planarization layer wherein one or both said layers are directed away from areas that should be free of deposition by an inert gas.

48. The method as recited in claim 47 wherein the at least one said step accomplished in an inert atmosphere is the step of depositing at least one planarization layer.

49. The method as recited in claim 47 wherein the at least one said step accomplished in an inert atmosphere is the step of depositing at least one barrier layer.

50. The method as recited in claim 47 wherein the at least one said step accomplished in an inert atmosphere is both the step of depositing at least one planarization layer and the stop of depositing at least one barrier layer.

51. The method as recited in claim 47 wherein said inert gas is injected through an array of nozzles and at least one of said planarization layer and said barrier layer are deposited using said array of nozzles.

52. An electronic device, said device comprising:

a substrate;

a plurality of active areas disposed upon said substrate;

a plurality of planarization layers disposed on said substrate whereby said planarization layer cover substantially only said active areas; and a plurality of barrier layers disposed on said substrate whereby said barrier layers cover substantially only said planarization layers.

53. The electronic device as recited in claim 52 wherein said electronic device comprises an OLED, an organic electronic circuit, an organic detector or, an organic solar cell.

* * * * *

UNITED STATES PATENT AND TRADEMARK OFFICE
CERTIFICATE OF CORRECTION

PATENT NO.    : 6,949,389 B2
DATED         : September 27, 2005
INVENTOR(S)   : Karl Pichler and Kyle D. Frischknecht It is certified that error appears in the above-identified patent and that said Letters Patent is hereby corrected as shown below:

<u>Title page,</u>
Item [75], Inventors, second inventor should read -- Kyle D. Frischknecht --.

Signed and Sealed this

Seventh Day of February, 2006

JON W. DUDAS
*Director of the United States Patent and Trademark Office*